(12) United States Patent
Balachandran et al.

(10) Patent No.: US 6,240,619 B1
(45) Date of Patent: *Jun. 5, 2001

(54) THERMOMECHANICAL MEANS TO IMPROVE THE CRITICAL CURRENT DENSITY OF BSCCO TAPES

(75) Inventors: Uthamalingam Balachandran, Hinsdale; Roger Poeppel, Glen Ellyn, both of IL (US); Pradeep Haldar, Latham, NY (US); Leszek Motowidlo, Waterbury, CT (US)

(73) Assignee: The University of Chicago, Chicago, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/662,515

(22) Filed: Jun. 13, 1996

Related U.S. Application Data

(63) Continuation of application No. 08/323,890, filed on Oct. 17, 1994, now abandoned.

(51) Int. Cl.$^7$ .................................................. H01L 39/24
(52) U.S. Cl. ..................... 29/599; 174/125.1; 505/432; 505/433
(58) Field of Search ................... 174/125.1; 505/432, 505/433

(56) References Cited

U.S. PATENT DOCUMENTS

| 4,980,964 | | 1/1991 | Boeke . | |
|---|---|---|---|---|
| 5,081,072 | * | 1/1992 | Hosokawa et al. | 29/599 X |
| 5,204,316 | * | 4/1993 | Argeot et al. | 29/599 X |
| 5,288,699 | * | 2/1994 | Sato et al. | 29/599 X |
| 5,807,808 | * | 9/1998 | Hikata et al. | 29/599 X |
| 5,877,125 | * | 3/1999 | Sato et al. | 29/599 X |

OTHER PUBLICATIONS

Microstructural Study of Bi (2223) /Ag Tapes with $J_c$ (77 K, OT) Values up to 3.3 ×10$^4$ A cm $^{-2}$ Supercond.Sci Tech. 4 (1991) 165–171.

Reaction Mechanism of High–$T_c$ Phase ($T_c$=110K) Formation In the Bi–Sr–Ca–Cu–) Superconductive System, Jap. Journal of Applied Physics, No. 11, Nov. 1989, pp. L1918–1921.

* cited by examiner

*Primary Examiner*—Carl J. Arbes
(74) *Attorney, Agent, or Firm*—Emrich & -Dithmar

(57) ABSTRACT

A method of preparing wires or tapes including Bi-2223 superconductor material by providing oxide and carbonate sources of Bi, Sr, Ca, Cu and Pb, milling the material for a time not to exceed about 30 minutes but preferably not greater than 20 minutes to produce a homogeneous mixture. Then heat treating by calcining the milled mixture at a temperature of at least about 830° C. for a time not less than about 12 hours, followed by at least one additional milling for a time not to exceed about 20 minutes and one additional heat treatment, to produce an oxide powder having an average diameter in the 4 to 5 micron range. Then a silver or silver alloy tube is filled with the oxide powder, and shape formed into a rectangular tape. Then alternately thermally treating and mechanically working the tube filled with oxide powder by heating the filled tube to an elevated temperature of about 835° C. to 840° C. and reducing the diameter of the tube, repeating the thermal and mechanical treatment. The filled tube is held at the elevated temperature for a total time in the range of from about 48 hours to about 350 hours to provide $Pb_{0.4}$, $Bi_{1.8}$ $Sr_{2.0}$ $Ca_{2.2}$ $Cu_3$ $O_x$ where x is between 10 and 11.

16 Claims, No Drawings

THERMOMECHANICAL MEANS TO IMPROVE THE CRITICAL CURRENT DENSITY OF BSCCO TAPES

This is a continuation of application Ser. No. 08/323,890, filed Oct. 17, 1994 now abondoned.

CONTRACTUAL ORIGIN OF THE INVENTION

The United States Government has rights in this invention pursuant to Contract No. W-31-109-ENG-38 between the U.S. Department of Energy and The University of Chicago representing Argonne National Laboratory.

BACKGROUND OF THE INVENTION

This invention relates to a method of manufacturing superconductor wire or tapes by the powder in tube process and to the material produced thereby. It has long been known that at sufficiently low temperatures certain materials become superconductors of electric currents by virtue of extremely low or the absence of electrical resistance. Substantial research is being directed to finding materials which become superconducting at temperatures above the atmospheric boiling point of liquid nitrogen. To date, these materials have been found to be ceramic and more particularly, oxides of certain combinations, one of which is the bismuth, strontium, calcium, copper oxide system known as the 2223 superconductor or the $Bi_2Sr_2Ca_2Cu_3O_x$ or BSCCO.

In the powder in tube method, an oxide precursor of the ultimate superconductor is packed into a silver or silver alloy tube which is used for both mechanical and thermal stabilization. Much of the research is directed toward commercializing methods of manufacture and to improving the current density or $J_c$ values of the superconducting material.

BRIEF DESCRIPTION OF THE INVENTION

The invention relates to a new method of preparing ceramic powders for introduction into silver or a silver alloy tube which is then swaged and then mechanically and thermally treated to produce the final tape or wire. It has been found that the process of preparing the powder is important as is the process for mechanically and thermally treating the filled tube to obtain high $J_c$ values.

A variety of methods are taught in the prior art, for instance those taught in the Boeke U.S. Pat. No. 4,980,964 issued Jan. 1, 1991, the disclosure of which is herein incorporated by reference as well as a paper entitled "Microstructural Study of Bi(2223)/Ag Tapes With $J_c$ (77K, 0T) Values of Up to $3.3 \times 10^4$ A $cm^{-2}$" by Yamada et al., see *Superconducting Science Technology*, 4 (1991) 165–171. However, the methods of the prior art do not produce material with sufficiently high $J_c$ values and have not recognized certain important aspects of processing which are the subject matter of this invention.

SUMMARY OF THE INVENTION

Accordingly, it is an object of the invention to provide a method of producing a powder for an improved Bi (2223) superconductor which can be formulated into a tape or wire having superior $J_c$'s;

Another object of the invention is to provide a Bi-2223 tape or wire having improved $J_c$'s and a method for commercially making same.

The invention consists of certain novel features and a combination of parts hereinafter fully described, and particularly pointed out in the appended claims, it being understood that various changes in the details may be made without departing from the spirit, or sacrificing any of the advantages of the present invention.

DESCRIPTION OF THE PREFERRED EMBODIMENT

A number of techniques are used to prepare Pb-doped Bi-2223 precursor powders, as it has been found that Pb present in an amount of 0.4 atom percent improves the characteristics of the Bi 2223 superconductor. They are solid state mixing of ingredients, such as carbonates and/or oxides; sol-gel methods; spray-pyrolysis of cation solution; calcination of the powders in ambient pressure or reduced pressure conditions. In some cases, two powder mixtures are calcined separately, then physically mixed to prepare the desired precursor powders which are then loaded into metallic tubes to prepare flexible conductors by the powder-in-tube technique, see for instance the Boeke U.S. Pat. No. 4,980,964 patent. All of the above techniques have resulted in silver clad Bi-2223 tapes with a range of transport $J_c$'s Often, very long milling/mixing is done at early and intermediate stages of powder processing. Surprisingly, we have found that this aggressive milling actually degrades the superconducting properties of the conductor, and we have found that by milling dry without any grinding media for short periods of time not to exceed a total of about 30 minutes, improved powders are fabricated.

Appropriate amounts of $Bi_2O_3$, PbO, $SrCO_3$, $CaCO_3$, and CuO were dry mixed in a SPEX mill for about ten minutes. The pre-mixed oxides and carbonates were heat treated in air at 830° C. to about 842° C. for about 24 to about 48 hours in divided treatments of from about 12 to about 24 hours. An intermittent milling in the SPEX mill was done for about 5 minutes. The calcined powders/pellets were then milled for one last time. It is critical in this invention to use a total milling time of less than about 30 minutes and preferably no more than about 20 minutes in order to prevent severe damage of the structure, size and morphology of the formed phases. The milled powders were characterized by XRD, DTA, SEM, and particle size analyzers and found to be between about 4 and about 5 microns in average diameter. Powders were thereafter packed in silver or silver alloy tubes and processed into flexible conductors. Transport $J_c$'s of about 30,000 A/cm² were obtained in short, rolled tapes when heat treated for less than 100 hours in air at 830–850° C. $J_c$'s as high as 50,000 A/cm² were obtained in rolled and pressed tapes. Long lengths of tapes with good properties were fabricated using the powders prepared as described above with alternate thermal and mechanical treating of the filled tubes as will hereinafter be described.

Previous to the present invention, ceramic powder has been packed in a silver tube and mechanically swaged and drawn into a fine, approximately 2 millimeter diameter wire. Thereafter the wire was rolled, that is passed between two rotating rollers, to produce flexible flat conductor tapes which were then sintered to make them superconducting. Prolonged, that is in the neighborhood of 300–350 hours sintering at temperatures exceeding 800° C. has been necessary to form the 2223 phase ($T_c$ about 110 K).

This invention is based partly on the surprising discovery that prolonged sintering of the tape at temperatures greater than 800° C. alone does not result in a superconductor with the highest possible critical current density $J_c$. We have discovered that in order to achieve a higher $J_c$, it is necessary to alternate thermal treatment with mechanical working, which is rolling or pressing. For example, when we sintered a tape at about 850° C. for 350 hours, the $J_c$ was 1600 to 2500 A/cm$^2$. However, using the method of the present invention with three mechanical working or pressing steps during the sintering for 350 hours, the $J_c$ was about 17,500 A/cm$^2$ representing an 800 to 1000% increase. In order to produce the tapes previously discussed, the following schedule was used:

The tape was sintered at 50 hours at 850° C.; was cooled to room temperature and pressed at a pressure of about 1 GPa; sintered at about 850° C. for 100 hours; cooled and pressed; sintered for 100 hours; cooled and pressed; and sintered for 100 hours. The total time at 850° C. was still about 350 hours but the increase in the $J_c$ was unexpectedly large.

Although the starting powder was prepared by mixing lead oxide, bismuth oxide, strontium carbonate, calcium carbonate and copper oxide, the multiphase ceramic powder which is packed into a silver or silver alloy tube contains mixed phases of Pb-doped CuO, $Ca_2CuO_3$ (alkaline earth cuprate) and minor amounts of 2223 phase. The thermal treatment leads to a reaction between the constituents and forms the 2223 phase. During sintering, the 2223 grains grow and the alkaline earth cuprate and other secondary phases are consumed. The intermediate pressing or rolling breaks the secondary-phase particles into very small particles than can be consumed during the subsequent thermal treatment forming additional 2223 phase material.

It is believed that the diffusion links of cations are much shorter after the secondary phases are fragmented and dispersed within the matrix, as accomplished by the mechanical working. It is believed, but not proved, that the mechanical working also may enhance the texturing of the 2223 grains. Nevertheless, there is a limit to the number of intermediate mechanical workings and to the total sintering time. After all the secondary phases are consumed and transformed into 2223 phase material, additional sintering causes decomposition of the 2223 phase into undesired phases. The mechanical working introduces cracks in the ceramic material and too much mechanical working after the transformation into the 2223 phase is complete, results in cracks which do not heal because there is no chance for transient liquid formation during subsequent thermal treatment. Therefore, it is critical not to mechanically work or thermally treat the material too much, because decomposition of the 2223 phase material and crack formation in the ceramic deceases the $J_c$. In some experiments we have found that the $J_c$ decreased to about 10,000 A/cm$^2$ when the thermal mechanical processing was continued after 350 hours sintering with 3 intermediate mechanical working steps. In checking by x-ray diffraction methods, the material exhibited evidence of decomposition of the 2223 phase.

In a specific example, 1.77 grams of PbO, 8.3 grams of $Bi_2O_3$, 5.85 grams of strontium carbonate or the equivalent which is 4.106 grams of strontium oxide, 4.3 grams of calcium carbonate or its equivalent grams of calcium oxide and 4.72 grams of copper oxide were used as a starting material for the powder produced in the method set forth above. In general, the powder must be treated not less than 12 hours and not more than 48 hours at a temperature in the range of from about 830 to 842° C. The milling which was dry without grinding media was limited to a total of 20 minutes in three divided segments. The powder thereby produced was loaded into a silver tube, and after sealing drawn to reduce the diameter to about 60 mils. The circular wire is formed into a rectangular shape. Thereafter, it was rolled between rollers and pressed at pressures between 20 tons and about 80 tons. It was found that the mechanical working, that is, rolling, drawing and pressing had to be limited to a reduction in dimension (diameter or thickness) of not greater than about 15% per mechanical working or mechanical treatment, greater than this number resulting in damage to the morphology of the product.

The tape was heat treated for a time in the range of from between 48 hours and 350 hours at a temperature in the range from 835° C. to 840° C. with a minimum and maximum number of pressings being from 1 to 4. The rectangular shape forming step before rolling is important in order to obtain uniform long length tape and this is an important commercial step. An advantage of the subject invention is that the tapes produced by this invention can be bent and are generally flexible and flat. Moreover, the tapes of the present invention can be warmed after cooling to about liquid nitrogen temperatures without destroying the superconducting properties which can be reestablished after appropriate and subsequent cooling. Although some producers of superconducting tapes teach the use of copper, iron or other alloys, copper and iron are not suitable for the present invention since they react with the superconducting 2223 phase.

The subject invention has application in magnets, superconducting magnetic energy storage devices, electrical transmission devices or any other uses wherein long length flexible high temperature superconducting wire or tape is needed.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. A method of preparing wires or tapes including Bi-2223 superconductor material comprising, providing oxide and carbonate sources of Bi, Sr, Ca, Cu and Pb, dry milling the sources without grinding media to produce a homogeneous mixture, heat treating by calcining the milled mixture at a temperature of at least about 830° C. for a time not less than about 12 hours, followed by at least one additional milling for a total milling time not to exceed about 30 minutes and one additional heat treatment, to produce an oxide powder having an average diameter in the 4 to 5 micron range, filling a silver or silver alloy tube with the oxide powder, shape forming the tube into a rectangular tape, alternately thermally treating and mechanically working the tape by heating the tape to an elevated temperature of about 835° C. to 840° C. and reducing the thickness of the tape, repeating the thermal treatment and the mechanical working, wherein the tape is held at the elevated temperature for a total time in the range of from about 48 hours to about 350 hours to provide $Pb_{0.4}Bi_{1.8}Sr_{2.0}Ca_{2.2}Cu_3O_x$, where x is between 10 and 11, wherein the material has a $J_c$ value substantially greater than 2500 A/cm$^2$.

2. The method of claim 1, wherein calcining is at a temperature in the range of from about 830° C. to about 842° C.

3. The method of claim 1, wherein there are no more than 3 millings.

4. The method of claim 3, wherein the material is milled not more than a total of about 30 minutes.

5. The method of claim 1, wherein there are a total of three millings and a total of at least two calcining treatments.

6. The method of claim 1, wherein the total time for calcining does not exceed about 48 hours.

7. The method of claim 1, wherein each calcining step is between about 12 and about 24 hours.

8. The method of claim 1, wherein the sources of Bi, Sr, Ca, Cu and Pb include Pb doped $Bi_2Sr_2CaCu_2O$ and $Ca_2CuO_3$ and CuO.

9. The method of claim 8, wherein the Pb is added as PbO.

10. The method of claim 1, wherein the filled tube is drawn to produce a wire with a diameter of about 60 mils.

11. The method of claim 1, wherein the filled tube is drawn and rolled to produce the rectangular tape and then alternately heat treated and mechanically worked by rolling to produce a tape about 5 mils thick.

12. The method of claim 1, wherein each mechanical working step reduces the thickness of the wire or tape not more than about 15%.

13. The method of claim 12, wherein the mechanical working step includes pressing the wire or tape at a pressure in the range of from about 20 tons to about 80 tons.

14. The method of claim 1, wherein the tape is subjected to four thermal treatments and three mechanical workings, the thermal treatments are at a temperature not greater than 840° C. and the time the tape or wire is held at the elevated temperature is from about 50 hrs. to about 100 hrs. for each thermal treatment.

15. A method of preparing wires or tapes including Bi-2223 superconductor material comprising, providing oxide and carbonate sources of Bi, Sr, Ca, Cu and Pb, dry milling the sources without grinding media to produce a homogeneous mixture, heat treating by calcining the milled mixture at a temperature of at least about 830° C. for a time not less than about 12 hours, followed by at least one additional milling, said total milling time being less than about 30 minutes and with any one milling time not greater than about 20 minutes, and one additional heat treatment, to produce an oxide powder having an average diameter in the 4 to 5 micron range, filling a silver or silver alloy tube with the oxide powder, shape forming the tube into a rectangular tape, alternately thermally treating and mechanically working the tape by heating the tape to an elevated temperature of about 835° C. to 840° C. and reducing the thickness of the tape, repeating the thermal treatment and mechanical working, wherein the tape is held at the elevated temperature for a total time in the range of from about 48 hours to about 350 hours to provide $Pb_{0.4}Bi_{1.8}Sr_{2.0}Ca_{2.2}Cu_3O_x$, where x is between 10 and 11, where the material has a $J_c$ value substantially treater than 2500 $A/cm^2$.

16. The method of claim 15, wherein there are three millings and two calcining treatments.

* * * * *

UNITED STATES PATENT AND TRADEMARK OFFICE
CERTIFICATE OF CORRECTION

PATENT NO. : 6,240,619 B1
DATED : June 5, 2001
INVENTOR(S) : Uthamalingam Balachandran et al.

It is certified that error appears in the above-identified patent and that said Letters Patent is hereby corrected as shown below:

Claim 15,
Line 20, "where" should be -- wherein --;
Line 21, "treater" should be -- greater --.

Signed and Sealed this

Twenty-sixth Day of February, 2002

Attest:

Attesting Officer

JAMES E. ROGAN
Director of the United States Patent and Trademark Office